(12) United States Patent
Liu

(10) Patent No.: US 10,591,508 B2
(45) Date of Patent: Mar. 17, 2020

(54) MEMS INERTIAL SENSOR AND FORMING METHOD THEREFOR

(71) Applicant: MEMSEN ELECTRONICS INC, Tianjin (CN)

(72) Inventor: Lianjun Liu, Tianjin (CN)

(73) Assignee: MEMSEN ELECTRONICS INC., Nankai District, Tianjin (CN)

( * ) Notice: Subject to any disclaimer, the term of this patent is extended or adjusted under 35 U.S.C. 154(b) by 0 days.

(21) Appl. No.: 15/924,789

(22) Filed: Mar. 19, 2018

(65) Prior Publication Data

US 2018/0210006 A1 Jul. 26, 2018

Related U.S. Application Data

(63) Continuation of application No. 14/004,838, filed as application No. PCT/CN2012/071495 on Feb. 23, 2012, now Pat. No. 9,958,471.

(30) Foreign Application Priority Data

Mar. 15, 2011 (CN) .......................... 2011 1 0061571

(51) Int. Cl.
*G01P 15/125* (2006.01)
*G01C 19/5769* (2012.01)
(Continued)

(52) U.S. Cl.
CPC ........ *G01P 15/125* (2013.01); *B81C 1/00341* (2013.01); *G01C 19/5769* (2013.01); *G01P 15/18* (2013.01); *G01P 2015/0814* (2013.01)

(58) Field of Classification Search
CPC ........................ G01P 15/125; G01P 2015/0874
(Continued)

(56) References Cited

U.S. PATENT DOCUMENTS

| 5,243,861 A | 9/1993 | Kloeck et al. |
| 5,616,844 A | 4/1997 | Suzuki et al. |
| (Continued) |

FOREIGN PATENT DOCUMENTS

| CN | 1180934 A | 5/1998 |
| CN | 101059530 A | 10/2007 |
| (Continued) |

OTHER PUBLICATIONS

First Office Action for the Chinese Patent Application No. 201110061571.2, date of notification May 3, 2012. Partial English translation attached.

(Continued)

*Primary Examiner* — John E Chapman, Jr.
(74) *Attorney, Agent, or Firm* — Cantor Colburn LLP

(57) ABSTRACT

A method for forming an MEMS inertial sensor is provided, comprising: providing a first substrate having a first surface and a second surface, wherein providing the first substrate comprises providing a first base substrate and forming at least one conductive layer; providing a second substrate having a third surface and a fourth surface; bonding the first surface of the first substrate and the third surface of the second substrate together to form a first bonding interface; thinning the first base substrate from the second surface of the first substrate to remove part of the first base substrate; and forming a movable element of the MEMS inertial sensor, wherein the at least one conductive layer comprises a shielding layer, and the shielding layer is located between the first base substrate and the first bonding interface.

19 Claims, 12 Drawing Sheets

(51) Int. Cl.
*B81C 1/00* (2006.01)
*G01P 15/18* (2013.01)
*G01P 15/08* (2006.01)

(58) Field of Classification Search
USPC ............................................... 73/514.32
See application file for complete search history.

(56) References Cited

U.S. PATENT DOCUMENTS

| | | | |
|---|---|---|---|
| 6,048,774 | A | 4/2000 | Toshimasa et al. |
| 6,153,917 | A | 11/2000 | Matsunaga |
| 6,170,332 | B1 | 1/2001 | MacDonald |
| 6,308,569 | B1 | 10/2001 | Stewart |
| 7,250,353 | B2 | 7/2007 | Nasiri et al. |
| 9,448,251 | B2 | 9/2016 | Liu |
| 2005/0132803 | A1 | 6/2005 | Baldwin et al. |
| 2006/0213268 | A1 | 9/2006 | Asami et al. |
| 2010/0307246 | A1 | 12/2010 | Fujii et al. |
| 2011/0221455 | A1 | 9/2011 | Feyh |

FOREIGN PATENT DOCUMENTS

| | | |
|---|---|---|
| CN | 101786593 A | 7/2010 |
| CN | 101837944 A | 9/2010 |
| CN | 102156203 A | 8/2011 |
| JP | 11135804 A | 5/1999 |
| WO | 2010034552 A2 | 4/2010 |
| WO | 2010061777 A1 | 6/2010 |

OTHER PUBLICATIONS

International Search Report for International Application No. PCT/CN2012/071495; dated Jun. 7, 2012, with English Translation.
K. Funk et. al. "A Surface Micromachined Silicon Gyroscope Using a Thick Polysilicon Layer", IEEE Journal, 1999, pp. 57-60.
Second Office Action for the Chinese Patent Application No. 201110061571.2, date of notification Nov. 15, 2012. Partial English translation attached.
USPTO Final Office Action corresponding to U.S. Appl. No. 14/004,838; dated Apr. 17, 2017.
USPTO Final Office Action corresponding to U.S. Appl. No. 14/004,838; dated Apr. 4, 2016.
USPTO Non-Final Office Action corresponding to U.S. Appl. No. 14/004,838; dated Dec. 22, 2016.
USPTO Non-Final Office Action corresponding to U.S. Appl. No. 14/004,838; dated Nov. 27, 2015.

MEMS INERTIAL SENSOR AND FORMING
METHOD THEREFOR

CROSS REFERENCE TO RELATED
APPLICATIONS

The present application is a continuation of U.S. patent application Ser. No. 14/004,838, filed on Sep. 12, 2013, the entire contents of which are incorporated herein by reference and priority to which is hereby claimed. Application Ser. No. 14/004,838 is the U.S. National Stage of Application No. PCT/CN2012/071495, filed on Feb. 23, 2012. Priority under 35 U.S.C. § 119(a) and 35 U.S.C. § 365(b) is hereby claimed from Chinese patent application No. 201110061571.2, filed on Mar. 15, 2011, the disclosures of which are both also incorporated herein by reference.

FIELD OF THE INVENTION

The present invention relates to the technical field of semiconductor, and in particular to a MEMS inertial sensor and a method for forming the same.

BACKGROUND OF THE INVENTION

In control, detection and navigation systems of various moving objects, not only information of displacement, angular displacement and velocity but also information of acceleration and angular rate are needed. Inertial sensors (including acceleration sensors and angular velocity sensors) are devices for measuring acceleration and angular rate.

Since the end of 1980s, various miniature sensors have been produced with the development of the Micro-Electro-Mechanical-System (MEMS) technique. Due to that MEMS inertial sensor based on MEMS technology can be produced in batch, the disadvantages of the previous inertial sensors such as large size and high cost, are overcome, and thus MEMS sensor has become a dominating trend for many future applications.

The existing MEMS inertial sensor is usually implemented as a capacitive inertial sensor, which generally includes: a fixed electrode for detecting motion of an object; a movable sensitive element (usually referred to as a movable electrode), where the capacitance between the movable sensitive element and the fixed electrode is changed due to the motion of the object; and an electrical signal processor which is electrically connected with the fixed electrode and the movable electrode. In the MEMS inertial sensor, the movable sensitive element usually serves as part of a mass block to reduce the size and the weight of the whole device, and for the mass block, the greater is the mass, so is the inertia.

In the prior art, companies such as Bosch, ST, Freescale and ADI usually use deposited polycrystalline silicon as structural material for fabricating the MEMS inertial sensor (referred to as a polycrystalline silicon method below). The polycrystalline silicon method has the advantage of simple process, but the material has relatively high stress, which affects device reproducibility and increase in film thickness, and therefore limits the size and sensitivity of the inertial sensor. Moreover, due to the poor reproducibility, production yield is reduced, and cost is increased.

U.S. Pat. No. 6,170,332B1 discloses a micromechanical acceleration sensor, which is fabricated by using a single silicon wafer, and each part of the MEMS inertial sensor is formed on the one wafer by etching. But due to the inherent disadvantage of etching technology, i.e., non-uniformity, the performance of the formed sensor such as the reliability may be affected.

Moreover, in the aforementioned US patent, the Z-axis sensor detects the Z-axis acceleration by detecting the change in overlapping area between the capacitor electrodes due to the displacement in the vertical direction, thereby limiting the design of the vertical-direction (Z-axis) sensor.

SUMMARY OF THE INVENTION

A method for forming an MEMS inertial sensor is provided according to an embodiment of the invention, and the method includes: providing a first substrate having a first surface and a second surface opposite to the first surface, wherein providing the first substrate comprises providing a first base substrate with the first surface and the second surface being located at two opposite sides of the first base substrate and forming at least one conductive layer on one side of the first base substrate closer to the first surface of the first substrate, wherein the first base substrate comprises a monocrystalline material, and wherein forming the at least one conductive layer comprises forming one or more of the at least one conductive layer via a deposition process; providing a second substrate having a third surface and a fourth surface opposite to the third surface; bonding the first surface of the first substrate and the third surface of the second substrate together to form a first bonding interface; thinning the first base substrate from a side of the second surface of the first substrate to remove part of the first base substrate; and forming a movable element of the MEMS inertial sensor, wherein the movable element comprises all or part of the thinned first base substrate, wherein the at least one conductive layer comprises a shielding layer, and the shielding layer is located between the first base substrate and the first bonding interface.

An MEMS inertial sensor is further provided according to an embodiment of the invention, and the MEMS inertial sensor includes a first substrate and a second substrate, wherein the first substrate has a first surface and a second surface opposite to the first surface; wherein the first substrate comprises a first base substrate, the first base substrate comprises a monocrystalline material, and the first surface and the second surface are located at two opposite sides of the first base substrate; wherein the first substrate further comprises at least one conductive layer, wherein the at least one conductive layer is formed on one side of the first base substrate closer to the first surface of the first substrate; wherein the second substrate has a third surface and a fourth surface opposite to the third surface; wherein the first surface of the first substrate and the third surface of the second substrate are bonded together to form a first bonding interface; wherein all or part of the first base substrate forms a movable element of the MEMS inertial sensor; and wherein the at least one conductive layer comprises a shielding layer and the shielding layer is located between the first base substrate and the first bonding interface.

Another method for forming an MEMS inertial sensor is further provided according to an embodiment of the invention, and the method includes: providing a first substrate having a first surface and a second surface opposite to the first surface, wherein providing the first substrate comprises: providing a first base substrate with the first surface and the second surface being located at two opposite sides of the first base substrate, and forming at least one conductive layer and an insulating layer on one side of the first base substrate closer to the first surface of the first substrate, wherein the insulating layer comprises a silicon nitride material, wherein the first base substrate comprises a monocrystalline material, and wherein forming the at least one conductive layer comprises forming one or more of the at least one conductive layer via a deposition process; providing a second substrate having a third surface and a fourth surface opposite to the third surface; bonding the first surface of the first substrate and the third surface of the second substrate together to form a first bonding interface; thinning the first base substrate from a side of the second surface of the first substrate to remove part of the first base substrate; and forming a movable element of the MEMS inertial sensor, wherein the movable element comprises all or part of the thinned first base substrate, wherein the insulating layer is located between one or more of the at least one conductive layer and the first bonding interface.

Another MEMS inertial sensor is further provided according to an embodiment of the invention, and the MEMS inertial sensor includes a first substrate and a second substrate, wherein the first substrate has a first surface and a second surface opposite to the first surface; wherein the first substrate comprises a first base substrate, the first base substrate comprises a monocrystalline material, and the first surface and the second surface are located at two opposite sides of the first base substrate; wherein the first substrate further comprises an insulating layer and at least one conductive layer located on one side of the first base substrate closer to the first surface of the first substrate, and wherein the insulating layer comprises a silicon nitride material; wherein the second substrate has a third surface and a fourth surface opposite to the third surface; wherein the first surface of the first substrate and the third surface of the second substrate are bonded together to form a first bonding interface; wherein all or part of the first base substrate forms a movable element of the MEMS inertial sensor; and wherein the insulating layer is located between one or more of the at least one conductive layer and the first bonding interface.

Since the sensitive element of the sensor is formed of monocrystalline semiconductor material (the first substrate), thicker movable sensitive element, i.e., the movable electrode, of the inertial sensor may be formed, thereby increasing the mass of the element, and improving the sensitivity and reliability of the MEMS inertial sensor. Moreover, since the sensitive element of the sensor is formed of monocrystalline semiconductor material (the first substrate), the reproducibility and the yield of fabricating the MEMS inertial sensor can be improved.

Moreover, in the embodiment of the invention, one or more conductive layers are formed on the first substrate, and the one or more conductive layers may be used to fabricate the electrical shielding layer of the MEMS inertial sensor, the interconnecting layer of the MEMS inertial sensor, the fixed electrode of the MEMS inertial sensor, the supporting post of the fixed electrode of the MEMS inertial sensor, the supporting post of the movable sensitive element of the MEMS inertial sensor, or any combination thereof. Thus, the manufacturing process is simpler, the flexibility for manufacturing the MEMS inertial sensor is enhanced, the layout becomes easier, and the flexibility for integrating with other devices is improved. The electrical shielding layer is electrically connected with the shielding interconnecting line of the interconnecting layer, and therefore the MEMS inertial sensor is shielded from external interference.

Moreover, in the embodiments of the invention, the MEMS inertial sensor includes an anti-stiction structure which is fabricated by using the first substrate or the one or more conductive layers, and thus the process for forming the anti-stiction structure is simple.

DETAILED DESCRIPTION OF THE INVENTION

Figure 1:
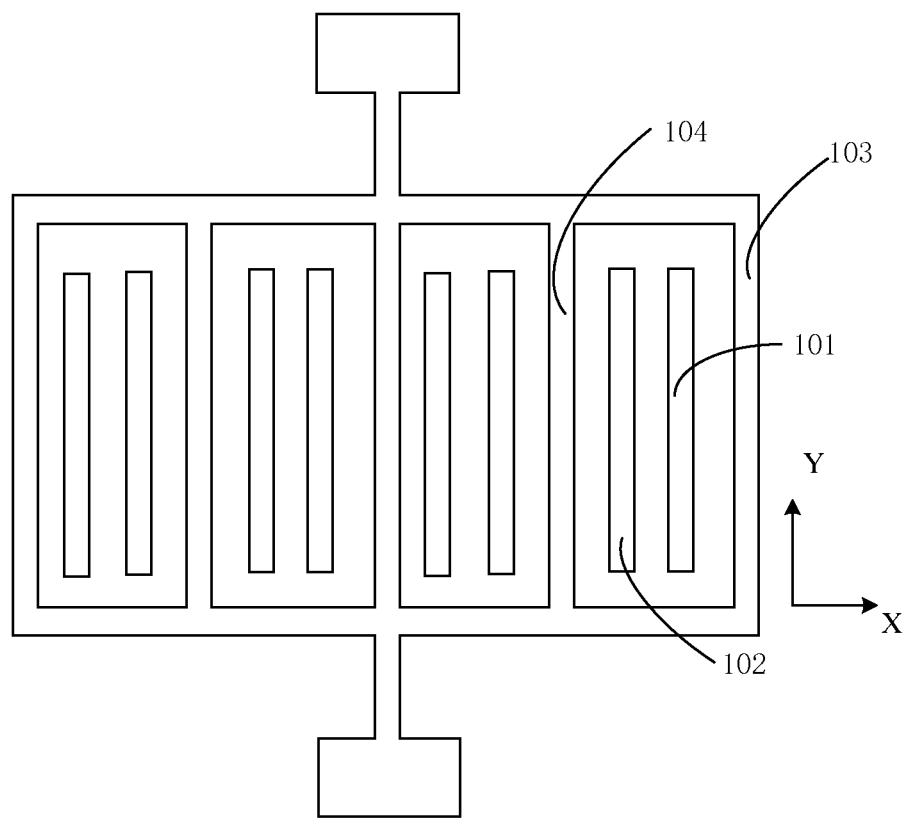
FIG. 1 is a schematic structural diagram of an X-axis sensor and a Y-axis sensor according to an embodiment of the invention.

In the embodiments of the invention, since the sensitive element of the sensor is formed of monocrystalline semiconductor material (the first substrate), thicker movable sensitive element, i.e., the movable electrode, of the inertial sensor may be formed, therefore improving the sensitivity and reliability of the MEMS inertial sensor. Moreover, since the sensitive element of the sensor is formed of monocrystalline semiconductor material (the first substrate), the reproducibility and the yield of fabricating the MEMS inertial sensor can be improved.

Moreover, in the embodiments of the invention, one or more conductive layers are formed on the first substrate, and the one or more conductive layers may be used to fabricate the electrical shielding layer of the MEMS inertial sensor, the interconnecting layer of the MEMS inertial sensor, the fixed electrode of the MEMS inertial sensor, the supporting post of the fixed electrode of the MEMS inertial sensor, the supporting post of the movable sensitive element of the MEMS inertial sensor, or any combination thereof. Thus, the manufacturing process is simpler, the flexibility for manufacturing the MEMS inertial sensor is enhanced, the layout becomes easier, and the flexibility for integrating with other devices is improved. The electrical shielding layer is electrically connected with the shielding interconnecting line of the interconnecting layer, and therefore the MEMS inertial sensor is shielded from external interference.

Moreover, in the embodiments of the invention, the MEMS inertial sensor includes an anti-stiction structure which is fabricated by using the first substrate or the one or more conductive layers, and thus the process for forming the anti-stiction structure is simple.

To achieve the above object, the following technical solutions are provided according to the invention.

Firstly, a MEMS inertial sensor is provided according to an embodiment of the invention, and the MEMS inertial sensor includes: a movable sensitive element, a second substrate and a third substrate. The movable sensitive element is located between the second substrate and the third substrate and formed by using a first substrate which is formed of a monocrystalline semiconductor material, the first substrate includes a first surface and a second surface which are opposite to each other, one or more conductive layers are formed on the first surface of the first substrate, the second substrate is coupled to a surface of the one or more conductive layer on the first substrate, and the third substrate is coupled to the second surface of the first substrate in which the movable sensitive element of the inertial sensor is formed. The second substrate may be coupled to a surface of the one or more conductive layers on the first substrate directly or via a coupling layer, and the third substrate and the second substrate are respectively arranged on two opposite sides of the movable sensitive element.

The MEMS inertial sensor according to the invention may be an acceleration sensor or a gyroscopic apparatus (which is also referred to as a gyroscope). No matter the MEMS inertial sensor is a gyroscopic apparatus or an acceleration sensor, the MEMS inertial sensor includes a sensor unit for signal conversion (for example, converting the acceleration or the angular rate of rotation into an electrical signal). The sensor unit includes a movable sensitive element (which is also referred to as a movable electrode), a fixed electrode, an interconnecting layer for respectively coupling to the movable electrode and the fixed electrode, and supporting posts for respectively supporting the movable electrode and the fixed electrode. The sensor unit is the core of the MEMS inertial sensor. The movable electrode of the MEMS inertial sensor according to the invention is formed of monocrystalline semiconductor material.

Generally, the acceleration sensor includes an X-axis sensor, a Y-axis sensor, a Z-axis sensor or any combination thereof. A schematic top view of the structure of the X-axis sensor of the acceleration sensor according to an embodiment of the invention is shown in FIG. 1, and the X-axis sensor includes a fixed electrode and a movable electrode. The fixed electrode includes two adjacent fixed electrode fingers, i.e., a first fixed electrode finger 101 and a second fixed electrode finger 102. The movable electrode includes movable electrode fingers arranged in parallel, i.e., a first movable electrode finger 103 and a second movable electrode finger 104. The two ends of each of the movable electrode fingers are respectively connected to two movable connecting arms arranged in parallel (not shown). A movable electrode finger is arranged between every two adjacent fixed electrode fingers in an alternative way, therefore the first fixed electrode finger 101 and the first movable electrode finger 103 form a first capacitor, and the second fixed electrode finger 102 and the second movable electrode finger 104 form a second capacitor. When the movable electrode moves along the X axis, the distance between the two parallel plates of the capacitor will be changed, and the two capacitors changes in an opposite way, so the acceleration of the acceleration sensor in the X axis direction can be obtained by detecting the changing capacitance.

The acceleration sensor may further include a Y-axis sensor. As known by those skilled in the art, the structure of the Y-axis sensor is similar to that of the X-axis sensor, and it is not described in detail herein.

Figure 2:
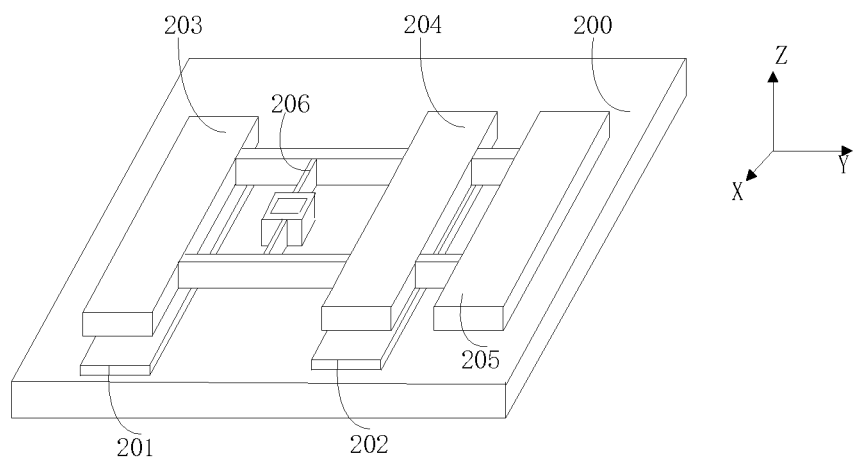
FIG. 2 is a schematic structure stereogram of a Z-axis sensor according to an embodiment of the invention.
Figure 3:
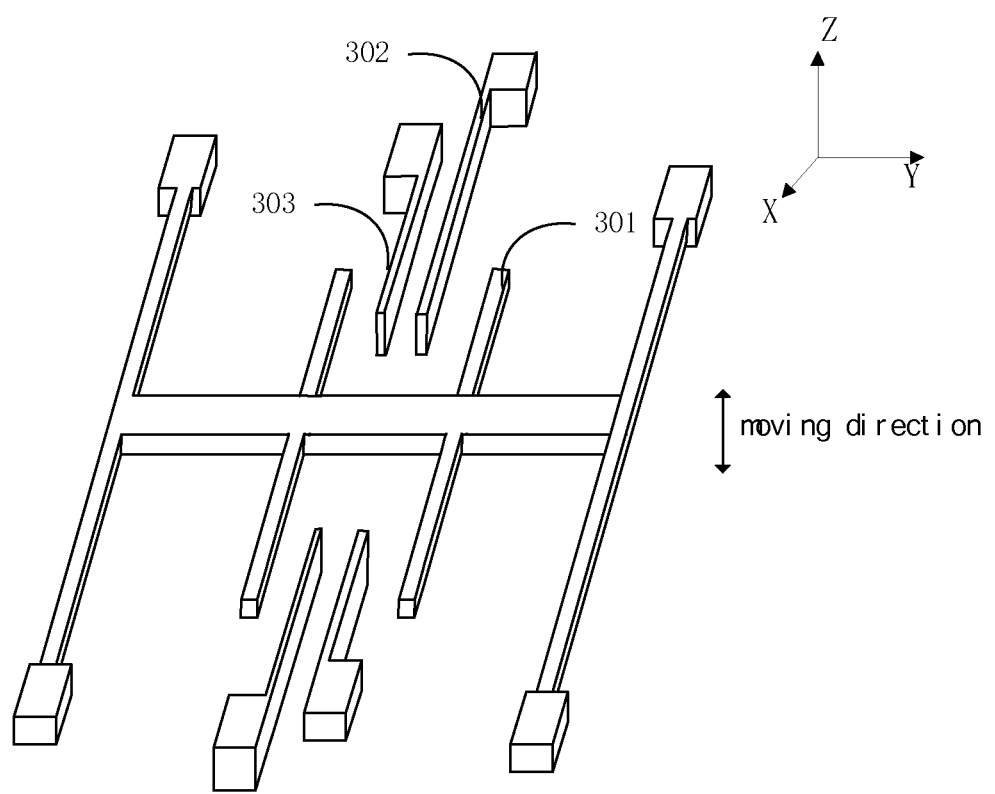
FIG. 3 is a schematic structure stereogram of a Z-axis sensor according to another embodiment of the invention.

The acceleration sensor may further include a Z-axis sensor. Referring to FIG. 2 and FIG. 3, the Z-axis sensor generally has two types of structures. Firstly, referring to FIG. 2, the Z-axis sensor includes a fixed electrode and a movable electrode. The fixed electrode includes a first fixed electrode 201 and a second fixed electrode 202. The movable electrode includes a first movable electrode 203 and a second movable electrode 204. The fixed electrode is fixed on a substrate 200. The movable electrode may move around a torsion spring 206. A seismic mass is further provided on the movable electrode. In this embodiment, a seismic mass 205 is provided on the outside of the second movable electrode 204, so the movable electrodes have an asymmetric structure with respective to the torsion spring 206. The fixed electrode and the movable electrode form two parallel plates of a capacitor. Under acceleration, the capacitance between the fixed electrode and the movable electrode will be changed, so the acceleration information of the acceleration sensor in the Z axis direction can be obtained by detecting the change of the capacitance.

FIG. 3 illustrates another Z-axis sensor, including a movable electrode and a fixed electrode. The movable electrode includes multiple movable electrode fingers 301. The middle of the multiple movable electrode fingers 301 are connected by a crossbar to form an integrated structure and may move up and down. The fixed electrode includes a first fixed electrode finger 302 and a second fixed electrode finger 303. The first fixed electrode finger 302 and the second fixed electrode finger 303 are disposed oppositely to the movable electrode fingers 301 to form two capacitors. When the movable electrode fingers 301 moves up and down, the capacitances of the capacitors formed between the movable electrode finger 301 and the first fixed electrode finger 302 and between the movable electrode finger 301 and the second fixed electrode finger 303 are changed, so the acceleration information in the Z axis direction can be obtained.

The above two Z-axis sensors have different structures and similar sensing principles, that is, the acceleration information in Z axis direction is sensed according to the change of the capacitance of the capacitor formed between the movable electrode and the fixed electrode. However, the difference between the two Z-axis sensors is that, the capacitance is changed by changing the distance between the two parallel plates of the capacitor in the structure shown in FIG. 2, and the capacitance is changed by changing the overlapping area between the two parallel plates of the capacitor in the structure shown in FIG. 3.

Figure 4:
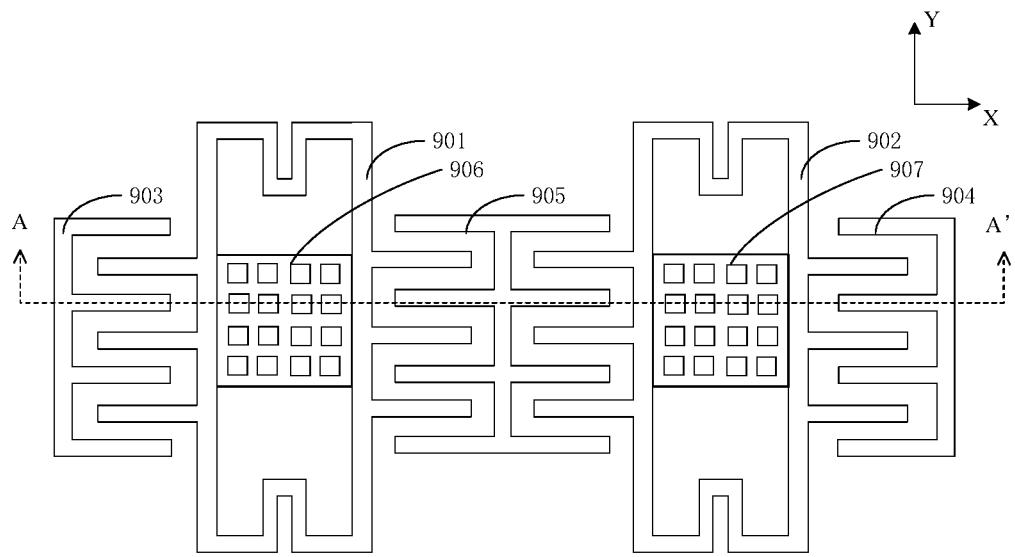
FIG. 4 is a schematic structure diagram of a gyroscopic apparatus according to an embodiment of the invention.
Figure 5:
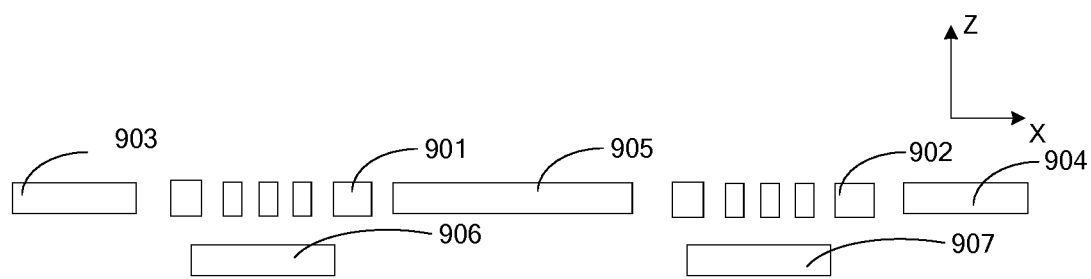
FIG. 5 is a schematic view of a sectional structure of a gyroscopic apparatus according to an embodiment of the invention.

FIG. 4 illustrates a schematic top view of the structure of a gyroscopic apparatus, and FIG. 5 illustrates a schematic view of the sectional structure taken along AA' in FIG. 4. The gyroscopic apparatus includes a movable electrode, a fixed electrode and a sensing electrode. Specifically, the movable electrode includes a first movable electrode 901 and a second movable electrode 902. The fixed electrode includes a first fixed electrode 903, a second fixed electrode 904 and a third fixed electrode 905, and the third fixed electrode 905 is provided between the first fixed electrode 903 and the second fixed electrode 904. The first movable electrode 901 is provided between the first fixed electrode 903 and the third fixed electrode 905. The second movable electrode 902 is provided between the second fixed electrode 904 and the third fixed electrode 905. Two interdigitated capacitors are respectively formed between the first movable electrode 901 and the first fixed electrode 903 and between the first movable electrode 901 and the third fixed electrode 905, and two interdigitated capacitors are respectively formed between the second movable electrode 902 and the second fixed electrode 904 and between the second movable electrode 902 and the third fixed electrode 905. When there is a potential difference between the first fixed electrode 903 and the first movable electrode 901, the first movable electrode 901 will move toward the first fixed electrode 903; and when there is a potential difference between the third fixed electrode 905 and the first movable electrode 901, the first movable electrode 901 will move toward the third fixed electrode 905; it is similar for the case between the second movable electrode 902 and the second fixed electrode 904 and between the second movable electrode 902 and the third fixed electrode 905. Therefore, under the action of an alternating current electrical signal, the first movable electrode 901 and the second movable electrode 902 will respectively move toward the first fixed electrode 903 and the second fixed electrode 904, or move toward the third fixed electrode 905.

The gyroscopic apparatus further includes a first sensing electrode 906 and a second sensing electrode 907. The first sensing electrode 906 and the second sensing electrode 907 respectively overlapp with the first movable electrode 901 and the second movable electrode 902, and there is an air cavity or medium between the sensing electrode and the movable electrode, referring to FIG. 5. A capacitor is formed between the sensing electrode and the movable electrode. When the first movable electrode 901 and the second movable electrode 902 move along the X axis, and the device rotates in the Y axis direction, the first movable electrode 901 and the second movable electrode 902 will move in the Z axis direction, and the capacitance of the capacitor formed between the sensing electrode and the movable electrode will be changed, so the angular rotation rate information can be sensed.

In the above description of the acceleration sensor and the gyroscopic apparatus, only the structures of the fixed electrode and the movable electrode are given, and the actual acceleration sensor and gyroscopic apparatus further include other structures such as the followings:

a first substrate for forming the movable electrode, the first substrate is formed of a monocrystalline semiconductor material, and the first substrate includes a first surface and a second surface. The second surface can be a surface of the first substrate after thinning. The MEMS inertial sensor includes the movable electrode of an acceleration sensor and a gyroscopic apparatus formed by using the thinned first substrate.

The MEMS inertial sensor may further include a second substrate. The second substrate is mainly used for mechanical support. The second substrate is coupled to the surface of the one or more conductive layers on the first substrate. If the one or more conductive layers include a first electrical shielding layer of the inertial sensor (the first electrical shielding layer is the conductive layer farthest from the first surface of the first substrate), the second substrate may be coupled to the surface of the first electrical shielding layer on the first substrate, no matter whether the one or more conductive layers include the interconnecting layer of the sensor. Further, if the second substrate is coupled to the first electrical shielding layer on the first substrate directly or via a conductive coupling layer, the second substrate and the first electrical shielding layer together serve as the electrical shielding layer of the inertial sensor. If the second substrate is coupled to the one or more conductive layers on the first substrate via a coupling layer and the coupling layer includes at least one insulating layer, the first electrical shielding layer solely serves as the electrical shielding layer of the inertial sensor.

The MEMS inertial sensor may further include a third substrate. The third substrate is coupled to the second surface of the first substrate. The third substrate is used to seal the sensor, and may include a circuit.

One or more conductive layers are formed on the first surface of the first substrate, and the one or more conductive layers include the first electrical shielding layer of the MEMS inertial sensor, the interconnecting layer of the MEMS inertial sensor, the supporting post of the fixed electrode of the MEMS inertial sensor, the supporting post of the movable sensitive element of the MEMS inertial sensor, or any combination thereof.

The one or more conductive layers include the first electrical shielding layer, or include not only the first electrical shielding layer but also the interconnecting layer. In a case that the one or more conductive layers include the first electrical shielding layer and the interconnecting layer, the interconnecting layer is closer to the first surface of the first substrate than the first electrical shielding layer.

The interconnecting layer includes one or more layers of interconnecting lines, which are electrically coupled with the fixed electrode, the movable electrode and the sensing electrode (gyroscopic apparatus) of the MEMS inertial sensor correspondingly.

The supporting posts are used to fixedly support the electrodes of the sensor. The supporting posts generally include connecting arms for electrically connecting the movable electrode, the fixed electrode and the sensing electrode (gyroscopic apparatus) and anchor of the movable electrode, and the fixed electrode and the sensing electrode.

If the one or more conductive layers include only the first electrical shielding layer of the MEMS inertial sensor, other structures of the MEMS inertial sensor such as the fixed electrode, the sensing electrode (gyroscopic apparatus), the interconnecting layer and the supporting post may be formed on other substrates. Certainly, the fixed electrode and the supporting post may be fabricated by using the conductive layer for forming the first electrical shielding layer, and the structures such as the interconnecting layer and the sensing electrode (gyroscopic apparatus) may be formed on other substrates. Moreover, the supporting post, such as the supporting post of the movable electrode, may be formed by using the first substrate.

If the one or more conductive layers is the interconnecting layer of the MEMS inertial sensor, other structures of the MEMS inertial sensor such as the fixed electrode, the sensing electrode (gyroscopic apparatus) and the supporting post may also be formed on other substrates, or certainly may be fabricated by using the material layer for forming the interconnecting layer of the MEMS inertial sensor, or may not be formed by using any particular one or more conductive layers but be formed by using other conductive material layers that are additionally formed. Furthermore, the supporting post such as the supporting post of the movable electrode may also be formed by using the first substrate.

If the one or more conductive layers include not only the interconnecting layer of the MEMS inertial sensor but also the first electrical shielding layer of the MEMS inertial sensor, the interconnecting layer is closer to the first surface of the first substrate than the first electrical shielding layer, other structures of the MEMS inertial sensor such as the fixed electrode, the sensing electrode (gyroscopic apparatus) and the supporting post may be formed on other substrates, or certainly may be formed by using the one or more conductive layers for forming the interconnecting layer of the sensor, or may not be formed by using any particular one or more conductive layers but be formed by using other one or more conductive material layers that are additionally formed. Furthermore, the supporting post such as the supporting post of the movable electrode may also be formed by using the first substrate.

Similarly, according to practical processes, requirements and purpose of the MEMS inertial sensor, various other designs and layouts may be made to the fixed electrode, supporting post, interconnecting layer and sensing electrode (gyroscopic apparatus) of the MEMS inertial sensor based on the spirit of the invention. It is noted that the scope of the invention should not be limited excessively herein.

If the MEMS inertial sensor is an acceleration sensor, the sensor includes an X-axis sensor, a Y-axis sensor, a Z-axis sensor or any combination thereof. Both the movable electrode and the fixed electrode of the X-axis sensor and the Y-axis sensor may be formed by using the first substrate.

If the Z-axis sensor has the structure as shown in FIG. 2, the fixed electrode of the Z-axis sensor is formed by using the one or more conductive layers. Preferably, if the one or more conductive layers include only the first electrical shielding layer, the fixed electrode of the Z-axis sensor is formed by using the material layer for forming the first electrical shielding layer. More preferably, if the one or more conductive layers include the interconnecting layer, the fixed electrode of the Z-axis sensor is formed by using the material layer for forming the interconnecting layer, no matter whether the one or more conductive layers include the first electrical shielding layer. Further preferably, the fixed electrode of the Z-axis sensor is formed by using the conductive material layer of the interconnecting layer closest to the first substrate.

If the Z-axis sensor has the structure as shown in FIG. 3, the fixed electrode of the Z-axis sensor is formed by using the first substrate.

More preferably, an anti-stiction structure is further formed on the side of the fixed electrode or the movable electrode of the Z-axis sensor of the acceleration sensor, for preventing stiction between the movable sensitive element and the fixed electrode when they come into contact with each other. The anti-stiction structure may be formed using the conductive layer material or the insulating layer material. As a preferable embodiment of the invention, the anti-stiction structure is formed by using one or more conductive layers, or is formed by using the first substrate. Preferably, no matter the Z-axis sensor has the structure shown in FIG. 2 or has the structure shown in FIG. 3, the anti-stiction structure is formed by using one or more conductive layers, and more preferably, is formed by using the conductive layer closest to the first substrate.

In a case that the MEMS inertial sensor is a gyroscopic apparatus, the gyroscopic apparatus includes an X-axis gyroscopic apparatus, a Y-axis gyroscopic apparatus, a Z-axis gyroscopic apparatus, or any combination thereof, and the X-axis gyroscopic apparatus, the Y-axis gyroscopic apparatus and the Z-axis gyroscopic apparatus respectively refer to the gyroscopic apparatus for sensing the angular rates in the X axis, the Y axis and the Z axis directions. The gyroscopic apparatus further includes a sensing electrode and a fixed electrode. As an embodiment, the fixed electrode of the X-axis gyroscopic apparatus or the Y-axis gyroscopic apparatus is formed by using the first substrate, and the sensing electrode of the X-axis gyroscopic apparatus or the Y-axis gyroscopic apparatus is formed by using the one or more conductive layers. Both the fixed electrode and the sensing electrode of the Z-axis gyroscopic apparatus are formed by using the first substrate.

Preferably, if the one or more conductive layer is the interconnecting layer of the gyroscopic apparatus, the sensing electrode of the X-axis gyroscopic apparatus or the Y-axis gyroscopic apparatus may be formed by using the material for forming the interconnecting layer.

Preferably, if the one or more conductive layers include only the first electrical shielding layer, the sensing electrode of the X-axis gyroscopic apparatus or the Y-axis gyroscopic apparatus may be formed by using the material for forming the first electrical shielding layer.

The fixed electrode of the gyroscopic apparatus is formed by using the first substrate. Since the formed fixed electrode may have a great thickness, the driving distance and speed may be designed to be high, thus increasing device sensitivity.

More preferably, an anti-stiction structure is formed on a side of the fixed electrode or the movable electrode of the X-axis gyroscopic apparatus or the Y-axis gyroscopic apparatus of the gyroscopic apparatus. Because the fixed electrode and the movable electrode of the X-axis gyroscopic apparatus or the Y-axis gyroscopic apparatus are formed by using the first substrate, the anti-stiction structure may be formed by using the first substrate or by using the one or more conductive layers.

In the invention, by forming one or more conductive layers on the first substrate, various MEMS inertial sensors can be formed flexibility. Because the movable electrode of the sensor is formed by using the first substrate, some deficiencies caused by the MEMS inertial sensor formed by using polycrystalline silicon layer in the prior art can be overcome, for example, the deficiency of the limited thickness due to the stress of the polycrystalline silicon in the prior art can be overcome.

Similarly, for the gyroscopic apparatus, the movable electrode is formed by using the monocrystalline semiconductor substrate, so the formed movable electrode has a great thickness and a great mass, thus the angular rate can be detected with high sensitivity.

Although in the abovementioned prior art the MEMS inertial sensor is also fabricated by using the monocrystalline silicon, the structure of the formed movable sensitive element is non-uniform and the performance such as the reliability of the device is affected because each portion of the MEMS inertial sensor is formed by etching which has a non-uniformity performance, as mentioned above.

Figure 6:
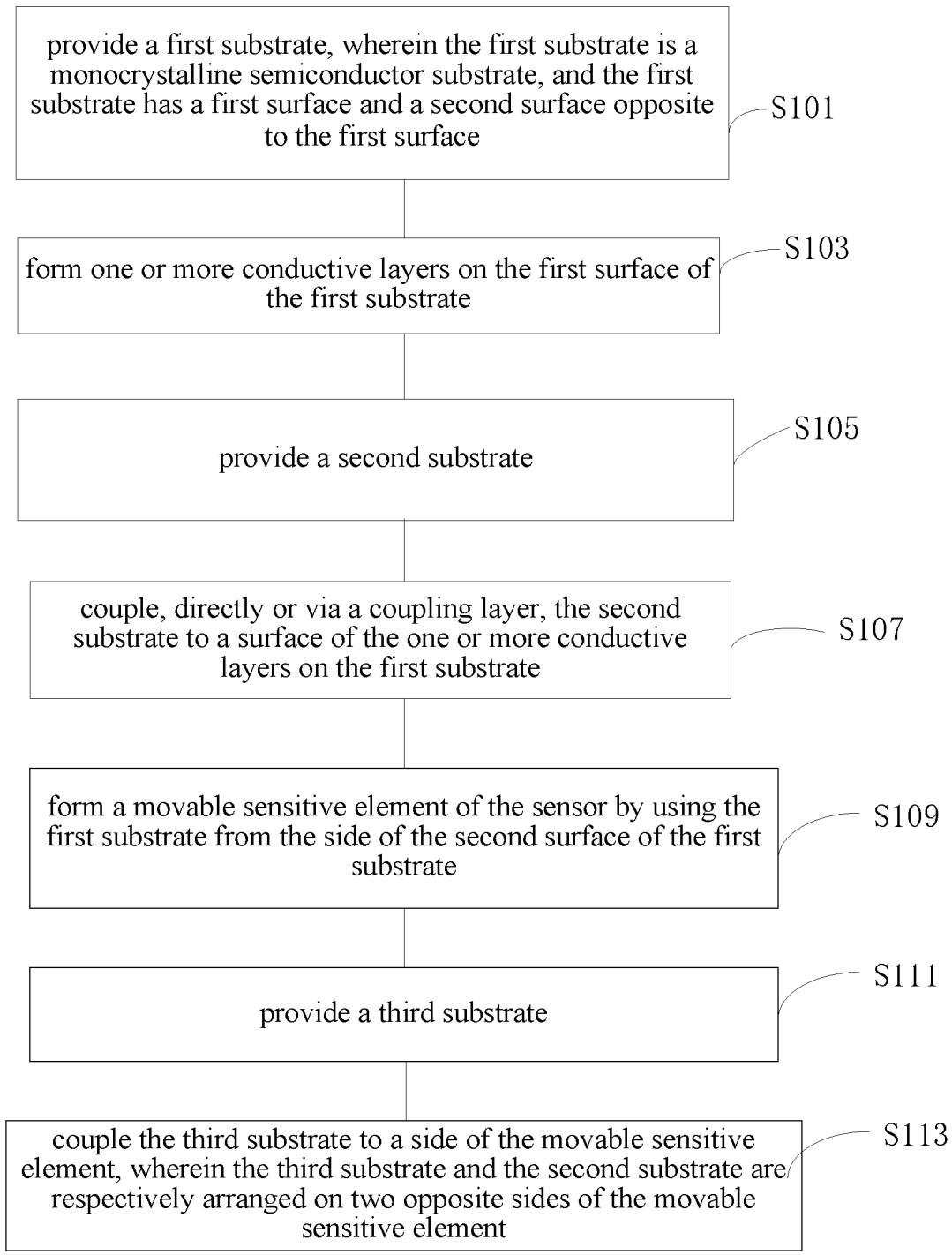
FIG. 6 is a flow chart of a method for forming an inertial sensor according to an embodiment of the invention.

An embodiment of a method for forming a MEMS inertial sensor is further provided according to the invention, and the method may be achieved by the following steps as shown in FIG. 6, including: step S101, providing a first substrate, the first substrate is a monocrystalline semiconductor substrate, the first substrate has a first surface and a second surface opposite to the first surface; step S103, forming one or more conductive layers on the first surface of the first substrate; step S105, providing a second substrate; step S107, coupling, directly or via a coupling layer, the second substrate to a surface of the one or more conductive layer on the first substrate; step S109, forming a movable electrode of the sensor by using the first substrate from the side of the second surface of the first substrate; step S111, providing a third substrate; and step S113, coupling the third substrate to the second surface of the first substrate. The method for forming the inertial sensor of the invention will be explained in detail below in conjunction with FIGS. 7 to 17.

As mentioned above, the one or more conductive layers on the first substrate according to the invention may include an interconnecting layer, a first electrical shielding layer, a supporting post of a fixed electrode, a supporting post of a movable electrode, or any combination of thereof. Therefore, the MEMS inertial sensor according to the invention has various structures, and various methods can be used to form these MEMS inertial sensors. In the embodiment of the method for forming the MEMS inertial sensor of the invention discussed below, an example is taken that the one or more conductive layers on the first substrate include not only the interconnecting layer and the supporting post of the fixed electrode but also the first electrical shielding layer. In a case that the one or more conductive layers on the first substrate have or include other structures, those skilled in the art can make an analogy based on the embodiment herein and the common technical knowledge in the art. It is noted that the scope of the protection of the invention should not be limited excessively herein.

Figure 7:
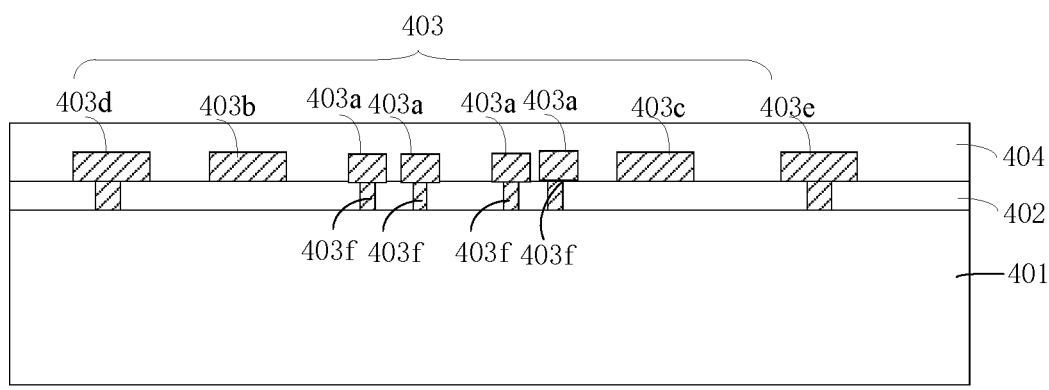
FIG. 7 to FIG. 17 are schematic views of sectional structures of a method for forming an inertial sensor of the invention according to an embodiment of the invention.

FIG. 7 is firstly referred to, a first substrate 401 is provided, and the first substrate 401 includes a first surface and a second surface opposite to the first surface.

The first substrate 401 may be formed of monocrystalline semiconductor material. For example, the first substrate 401 may be formed of monocrystalline semiconductor material such as monocrystalline silicon or monocrystalline germanium silicon. As an embodiment of the invention, the first substrate 401 is formed of monocrystalline silicon.

Forming an interconnecting layer on the first surface of the first substrate 401 includes: forming a first insulating layer 402 on the first surface of the first substrate 401, and etching the first insulating layer 402 to form a first opening in the first insulating layer 402, where the first substrate 401 is exposed through the first opening. The first insulating layer 402 may be formed of dielectric material such as silicon oxide, silicon nitride and silicon oxynitride. As an embodiment, the first insulating layer 402 is formed of silicon oxide.

A first conductive layer is formed on the first insulating layer 402, the first opening is filled with the first conductive layer, the first conductive layer is etched to form a first interconnecting line layer 403 which includes discrete interconnecting lines for different purposes and for leading out different signals respectively. In the embodiment, the first interconnecting line layer 403 includes: a fixed electrode interconnecting line 403a for leading out the fixed electrode of the sensitive element of the sensor, a first interconnecting line 403b, a second interconnecting line 403c, a first shielding interconnecting line 403d and a second shielding interconnecting line 403e, where the first shielding interconnecting line 403d and the second shielding interconnecting line 403e are used to electrically connect the corresponding electrodes to the electrical shielding layer of the sensor.

A supporting post 403f of the fixed electrode is further formed in the embodiment, and the supporting post 403f has a function of electrical connection and is electrically coupled with the fixed electrode interconnecting lines 403a. As an embodiment, the supporting post 403f of the fixed electrode and the interconnecting layer are formed by using the first conductive layer material for forming the interconnecting layer.

The first conductive layer may be formed of doped polycrystalline silicon or other conductive material. As an embodiment of the invention, the first conductive layer is formed of polycrystalline silicon. If the first conductive layer is formed of polycrystalline silicon, a step of doping the first conductive layer may be included.

Generally, forming a MEMS inertial sensor further includes forming a movable electrode interconnecting line for leading out the movable electrode and forming a movable electrode supporting post, which are not shown in the embodiment for simplification of the drawings, and those skilled in the art know how to form the movable electrode interconnecting line and the movable electrode supporting post. It is noted that the scope of the protection of the invention should not be limited excessively herein.

Then, a second insulating layer 404 is formed on the first interconnecting line layer 403, the gaps between the discrete interconnecting lines are filled with the second insulating layer 404. The second insulting layer 404 may be formed of dielectric material such as silicon oxide, silicon nitride and silicon oxynitride. As an embodiment of the invention, the second insulating layer 404 is formed of silicon oxide, which is the same as the first insulating layer 402.

Then, the second insulating layer 404 is etched to form openings (not shown), for electrical connection with material layers formed subsequently.

The actual MEMS inertial sensor may include multiple interconnecting layers, and there are insulating layers between the multiple interconnecting layers for isolation. In the embodiment, only one interconnecting layer is taken as an example for explanation.

Moreover, in the embodiment, while the interconnecting layer of the sensor is formed, other structures of the sensor such as the supporting post of the fixed electrode and the supporting post of the movable electrode (not shown) are also formed by using the material layer for forming the interconnecting layer, thus the processing steps are simplified.

Figure 8:
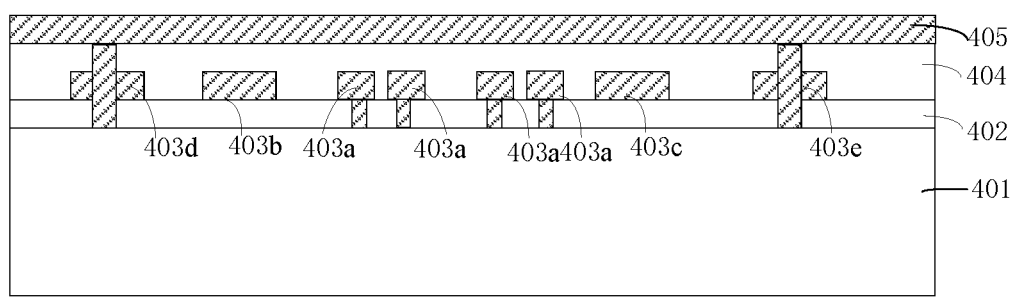

Referring to FIG. 8, a second conductive layer 405 is formed on the second insulating layer 404, and the second conductive layer 405 is used to fabricate the first electrical shielding layer. The first electrical shielding layer will eventually be coupled to an electrical shielding signal which may be a grounding signal, a direct current driving signal or other driving signals. The electrical shielding layer of the invention can be fabricated simply and designed flexibly.

Openings are formed in the second insulating layer 404 and fully filled with the second conductive layer 405 to electrically connect the first shielding interconnecting line 403d and the second shielding interconnecting line 403e correspondingly.

The second conductive layer 405 may be formed of doped polycrystalline silicon or other conductive materials. As an embodiment of the invention, the second conductive layer 405 may be formed of polycrystalline silicon, and a step of doping the polycrystalline silicon may be included, which will not be described in detail herein.

After the second conductive layer 405 is formed, a third insulating layer (not shown) may be formed on the second conductive layer 405, and the third insulating layer serves as a coupling layer in the subsequent bonding process with the second substrate. The third insulating layer is generally formed of silicon oxide.

Figure 9:
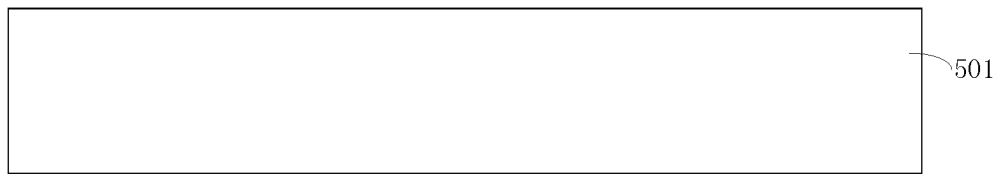

Referring to FIG. 9, a second substrate 501 is provided. The second substrate 501 is mainly used to provide mechanical supporting for the sensor. The second substrate 501 may be formed of monocrystalline semiconductor material. For example, the second substrate 501 may be formed of monocrystalline silicon, monocrystalline germanium or monocrystalline germanium silicon. Certainly, the second substrate 501 may also be formed of other materials. As an embodiment of the invention, the second substrate 501 is formed of monocrystalline silicon.

A fourth insulating layer (not shown) may further be formed on the second substrate 501. The fourth insulating layer serves as a coupling layer in the subsequent bonding process with the first substrate, for increasing the coupling force therebetween. The fourth insulating layer is preferably silicon oxide. Only one of the fourth insulating layer and the above-mentioned third insulating layer may be formed, or both of the two insulating layers may be formed, or neither of the two insulating layers is formed. Further, the coupling layer between the first substrate and the second substrate 501 may be formed of conductive material such as polycrystalline silicon, and it is noted that the scope of protection of the invention should not be limited excessively herein.

Figure 10:
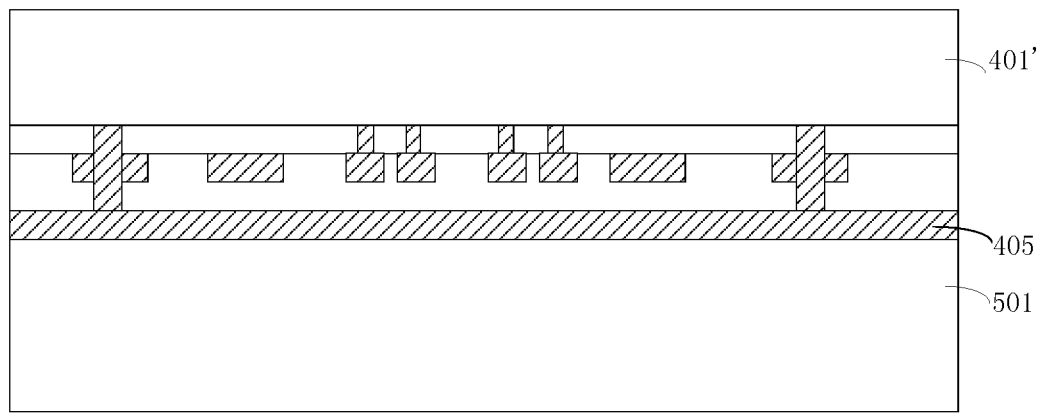

Then, referring to FIG. 10, the second substrate 501 is coupled to the surface of first electrical shielding layer and the interconnecting layer on the first substrate 401. The first substrate 401 and the second substrate 501 are combined into a MEMS wafer. The technique for coupling the second substrate 501 to the first substrate 401 is known in the art, which will not be described in detail herein.

If the second substrate 501 is coupled to the first electrical shielding layer of the first substrate 401 directly or via a conductive coupling layer, i.e., no other material layer or only a conductive coupling layer is formed between the second substrate 501 and the first electrical shielding layer of the first substrate 401, the first electrical shielding layer and the second substrate 501 together serve as the electrical shielding layer of the inertial sensor; and if the second substrate 501 is coupled to the first electrical shielding layer of the first substrate 401 via a coupling layer which includes at least one electrical insulating layer, for example, a fourth insulating layer is formed on the second substrate 501 or a third insulating layer is formed on the first electrical shielding layer, the first electrical shielding layer solely serves as the electrical shielding layer of the inertial sensor, which is specially noted herein.

Further, it is to be noted that before the second substrate 501 is coupled to the first substrate 401, the two coupling surfaces need to be polished. For example, the third insulating layer (if a third insulating layer is formed on the first electrical shielding layer) or the first electrical shielding layer on the first substrate 401 is polished. If a fourth insulating layer is formed on the second substrate 501, the fourth insulating layer may also need to be polished. The first and second substrates are subsequently coupled or bonded together.

Then, the first substrate 401 is thinned, from the second surface of the first substrate on which no interconnecting layer is formed, to 5 μm to 100 μm, and a first substrate 401' is formed after the thinning process. The newly formed surface of the first substrate 401' from thinning is still called the second surface of the first substrate. Then, the thinned first substrate 401' is used to form the movable electrode of the MEMS inertial sensor of the invention.

Figure 11:
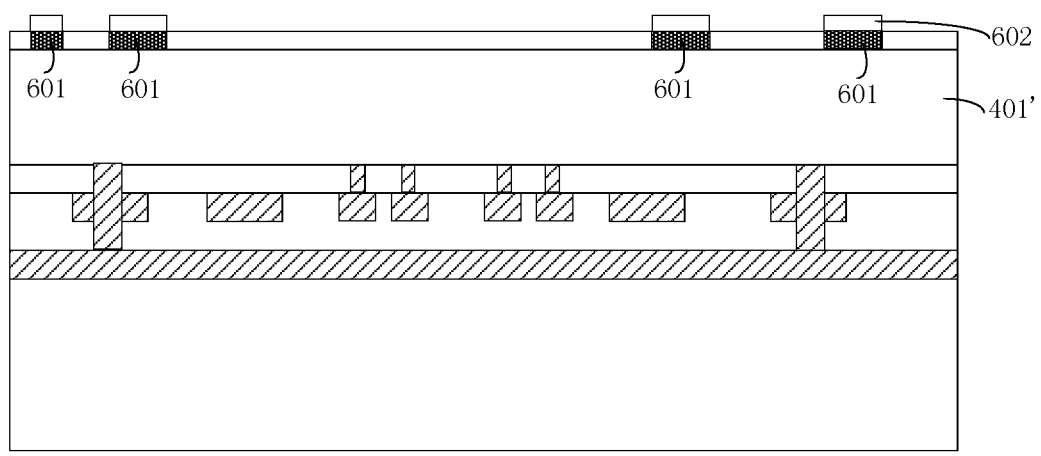

Referring to FIG. 11, an electrical connecting layer is formed on the second surface of the first substrate 401'. The electrical connecting layer is used to fabricate an adhering pad for subsequently coupling the third substrate to the first substrate, or to fabricate a wire-bonding pad for subsequently wire-bonding with a peripheral circuit, or to fabricate both of them.

It is noted that the electrical connecting layer is chosen according to the method for subsequently sealing the formed sensor. If the sealing is subsequently performed by the glass-bonding method, the wire-bonding pad is formed; and if the sealing is subsequently performed by the metal alloy, the adhering pad is formed. Moreover, the positions of the formed adhering pad and wire-bonding pad are also different, which can be referred to the description below for details.

No matter the electrical connecting layer is used to fabricate an adhering pad or a wire-bonding pad or both of them, the electrical connecting layer is fabricated by using conductive material such as metal, alloy or other conductive materials. Moreover, the electrical connecting layer may be formed of Al, Cu or other conductive adhering materials.

Then the electrical connecting layer is etched to remove the adhering layer not required for coupling with the third substrate or for forming wire-bonding pad (referring to the following for clarification), to expose part of the surface of the first substrate 401', and to form an electrical connection structure 601. The electrical connection structure 601 may be an adhering pad or a wire-bonding pad.

A first mask layer 602 is formed on the electrical connection structure 601 and the exposed first substrate 401'. The first mask layer 602 may be formed of photoresist, silicon oxide, silicon nitride or the like. The first mask layer 602 serves as a mask in the subsequent process for etching the first substrate 401'.

Figure 12:
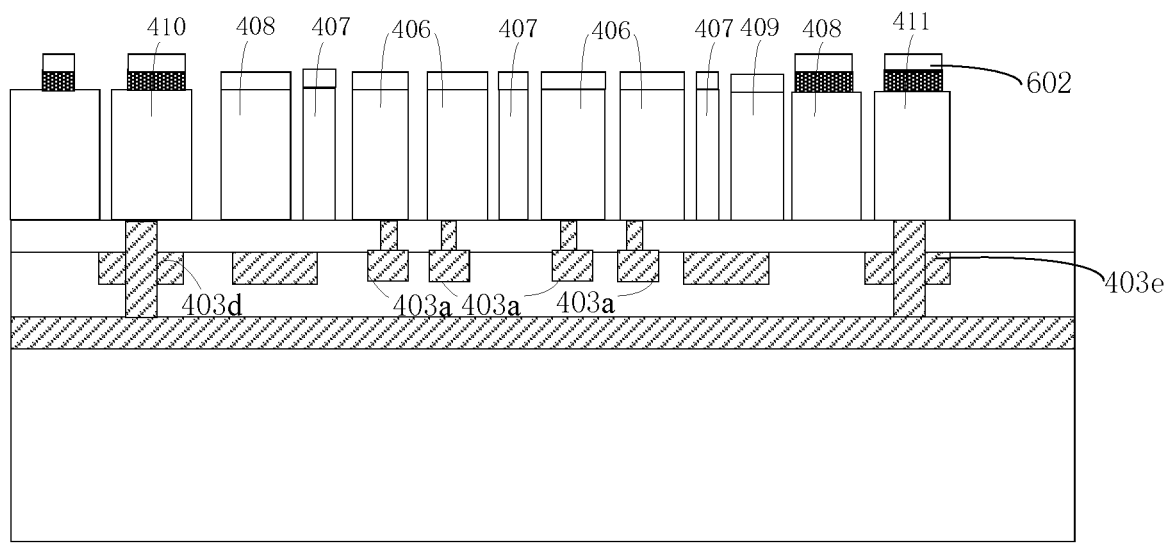

Referring to FIG. 12, the first mask layer 602 is patterned, and the pattern to be transferred is formed in the first mask layer 602.

Then, the first substrate 401' is etched by using the patterned first mask layer 602 as a mask, until the first insulating layer 402 is exposed. By this step, the primary structure of the MEMS inertial sensor is formed, including a fixed electrode 406 and a movable electrode 407, where the fixed electrode 406 is electrically coupled with the fixed electrode interconnecting line 403a, and the movable electrode 407 is electrically coupled with the movable electrode interconnecting line (not shown).

Meanwhile, a first sensor structure 408, a second sensor structure 409, a first sealing sensor structure 410 and a second sealing sensor structure 411 are formed by etching the first substrate 401'. The first sealing sensor structure 410 and the second sealing sensor structure 411 are electrically coupled with the first shielding interconnecting line 403d and the second shielding interconnecting line 403e correspondingly, and are used to seal the formed movable electrode and fixed electrode in the subsequent packaging process.

The fixed electrode 406 and the movable electrode 407 form two parallel plates of a capacitor.

Figure 13:
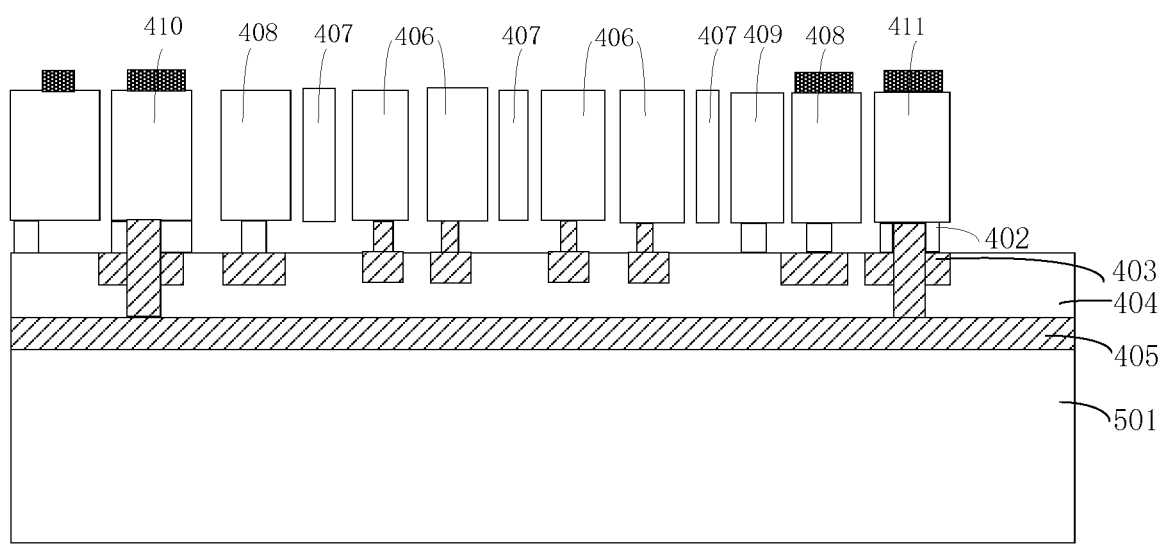

Referring to FIG. 13, part of the first insulating layer 402 is removed, the first insulating layer 402 under the movable electrode 407 is completely removed to release the movable electrode 407 and form a movable electrode 407 which is movable, thereby achieving the release of the structure of the sensitive element of the sensor. When the movable electrode 407 moves, the distance between the movable electrode 407 and the fixed electrode 406 will be changed.

During the process of removing part of the first insulating layer 402, the remained first mask layer 602 is also removed.

The etching agent for removing part of the first insulating layer 402 is selected based on the material of the first insulating layer. As an embodiment of the invention, the first insulating layer 402 is silicon oxide, and the etching agent for removing the first insulating layer 402 may be selected to be hydrofluoric acid. By controlling the etching time, the amount of the remained first insulating layer 402 under the first sensor structure 408, the second sensor structure 409, the first sealing sensor structure 410 and the second sealing sensor structure 411 can be controlled.

Figure 14:
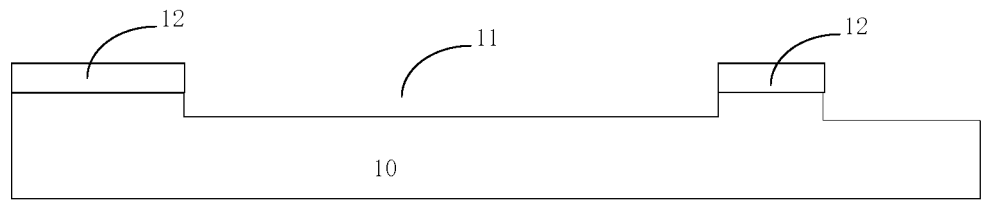

After the above processes, the sensor according to the embodiment of the invention is formed, and the sensor needs to be sealed subsequently. There are two methods for sealing using the third substrate, i.e., the adhering glass sealing method and the metal sealing method. FIG. 14 is firstly referred to, which includes:

providing a third substrate 10, and the third substrate 10 may be formed of silicon. A sealing cavity 11 is formed in the third substrate 10, and the position of the sealing cavity 11 corresponds to the position of the sensor, for containing the movable electrode and the fixed electrode of the MEMS inertial sensor. The third substrate 10 includes a coupling region, which will be subsequently coupled to the second surface of the first substrate and will hermetically seal the movable electrode and the fixed electrode of the formed MEMS inertial sensor inside the formed cavity.

Optionally, a fifth insulating layer 12 may be formed on the third substrate 10 around the sealing cavity 11, the fifth insulating layer 12 may be formed of silicon oxide, silicon nitride, silicon oxynitride or the like. As an embodiment, the fifth insulating layer 12 is formed of silicon oxide.

Figure 15:
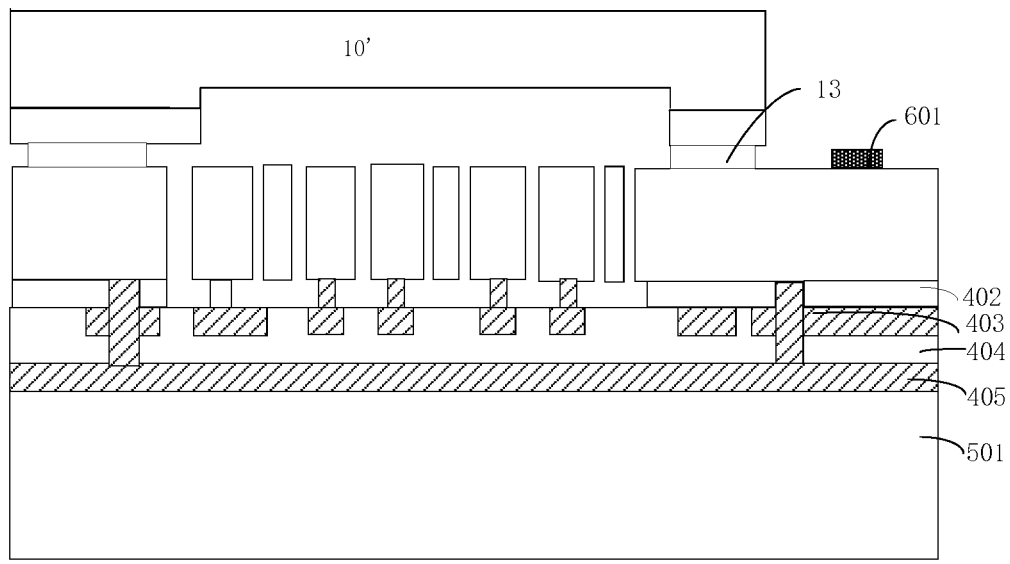

Referring to FIG. 15, an adhering glass 13 is provided. The adhering glass 13 is adhered to the corresponding coupling region on the third substrate 10. The third substrate with the adhering glass 13 is coupled to the second surface of the first substrate, and the third substrate is on the opposite side of the first substrate as the second substrate. Then part of the third substrate 10 is removed, to expose the electrical connection structure 601 and form a third substrate 10', i.e., the coupling region does not overlap with the electrical connection structure, which is a wire-bonding pad herein and will be electronically coupled with an external signal processing circuit later.

The third substrate 10 herein may include no electrical connection structure, i.e., may be a blank silicon wafer, or the third substrate 10 may be formed of an insulating material. If there is no electrical connection structure in the third substrate 10, the interconnecting layer, the supporting post, the fixed electrode and the electrical shielding layer of the sensor are formed on the first substrate. It is noted that those skilled in the art should know how to make a reasonable layout according to the packaging method.

Figure 16:
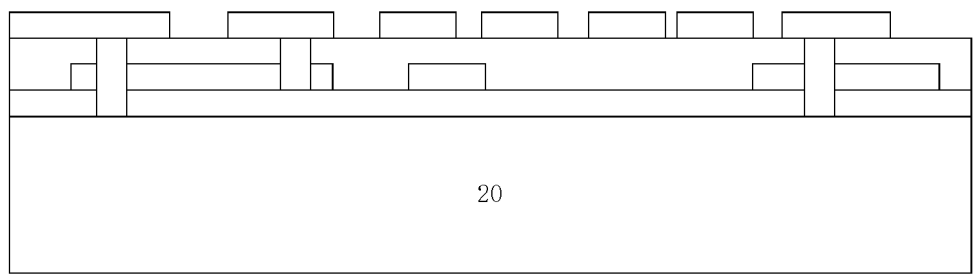

The metal sealing method will be described below. Referring to FIG. 16, a third substrate 20 is provided, and the third substrate 20 may be formed of silicon. A CMOS circuit (not shown), a lead, a wire-bonding pad or any combination thereof may be formed in the third substrate 20, or the third substrate 20 may include no other electrical structure.

Figure 17:
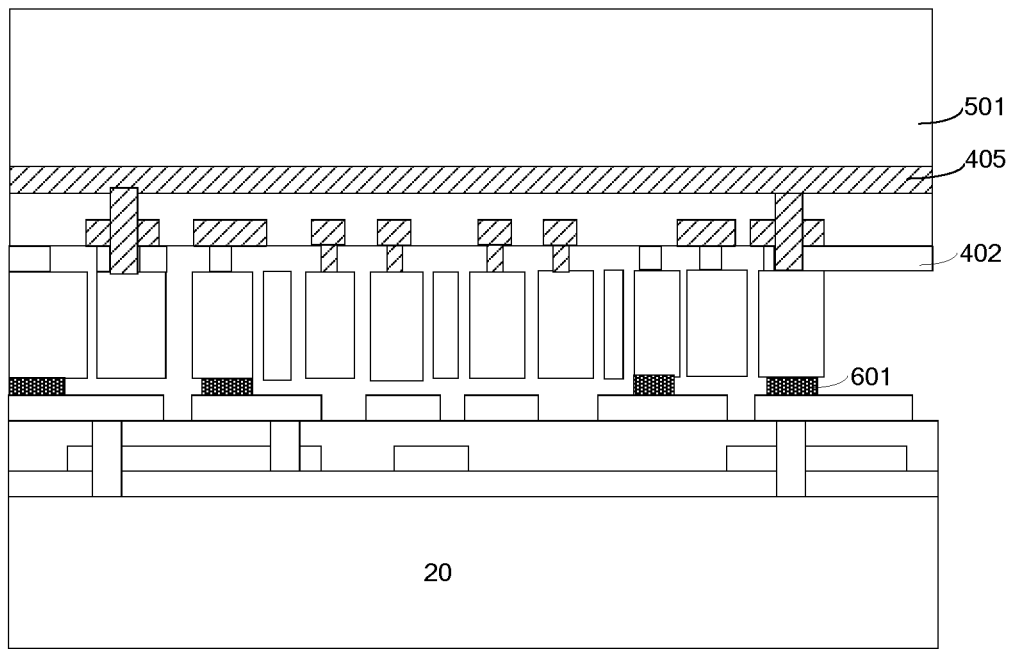

Referring to FIG. 17, the third substrate 20 is coupled to the second surface of the first substrate. The third substrate is on the opposite side of the first substrate as the second substrate. Part of the electrical connection structures 601 located on the second surface of the first substrate serves as the adhering layer herein, i.e., located in the adhering region, and the adhering layer is electrically coupled with the corresponding structures on the third substrate 20. Other part of the electrical connection structures 601 located on the second surface of the first substrate may serve as I/O electrodes.

If the sealing is performed by using the metal sealing method, the fixed electrode, the interconnecting layer, the supporting post and the sensing electrode (gyroscopic apparatus) of the MEMS inertial sensor may be formed on the first substrate or on the third substrate. It is noted that those skilled in the art should know how to make a reasonable layout according to the packaging method. It is emphasized that the scope of the protection of the invention should not be limited excessively herein.

In the aforementioned method for forming the MEMS inertial sensor, the method for forming the typical fixed electrode, movable electrode, first sealing sensor structure, second sealing sensor structure and the corresponding interconnecting layer and supporting posts are chosen for illustration. Meanwhile, in the above embodiment, the first interconnecting line, the second interconnecting line, the first sensor structure and the second sensor structure are further given to show other structures that may be used in the sensor. Here, from the embodiments, those skilled in the art should know that by using the method for forming the sensor according to the invention, not only the movable electrode suspended in the cavity, the fixed electrode fixed on the fixed electrode interconnecting line via the supporting post, and the first sealing sensor structure and the second sealing sensor structure on the first shielding electrode and the second shielding electrode can be formed, but also the first sensor structure and the second sensor structure fixed above the interconnecting layer via the first insulating layer can be formed, i.e., all the structures needed by the acceleration sensor can be formed by using the method of the invention. It is noted that the scope of the protection of the invention should not be limited excessively herein. In the above embodiment, the detailed description is given by taking the X-axis sensor of the acceleration sensor as an example. The method for forming the Y-axis sensor of the acceleration sensor is similar to that of the X-axis sensor, and those skilled in the art should know how to form the Y-axis sensor accordingly. The method for forming the Z-axis sensor of the acceleration sensor, whether the Z-axis sensor as shown in FIG. 2 or the Z-axis sensor as shown in FIG. 3, is similar to the method for forming the X-axis sensor, and the difference lies in the layout or design. Thus the method for forming the Z-axis sensor of the acceleration sensor will not be described in detail therein, and various modifications, amendments or supplements can be made by those skilled in the art based on the ordinary technical knowledge in the field and the embodiments of the invention.

Furthermore, the gyroscopic apparatus for sensing in each direction (i.e., the X-axis gyroscopic apparatus, the Y-axis gyroscopic apparatus and the Z-axis gyroscopic apparatus) has similar structure elements as those of the acceleration sensor (i.e., the X-axis sensor, the Y-axis sensor and the Z-axis sensor). The structures of both the acceleration sensor and the gyroscopic apparatus can be formed by using the method according to the invention, the difference only lies in the layout or design. Thus the method for forming the gyroscopic apparatus will not be described in detail therein, and various modifications, amendments or supplements can be made by those skilled in the art based on the ordinary technical knowledge in the field and the embodiments of the invention.

Another method for forming an inertial sensor is further provided according to the invention, and an anti-stiction structure is formed in the inertial sensor in the embodiment to prevent stiction between the movable electrode and other objects when they come into contact, and thus the device is prevented from being damaged. The description is given by taking the Z-axis acceleration sensor as an example, and FIG. 18 to FIG. 21 are referred to.

Figure 18:
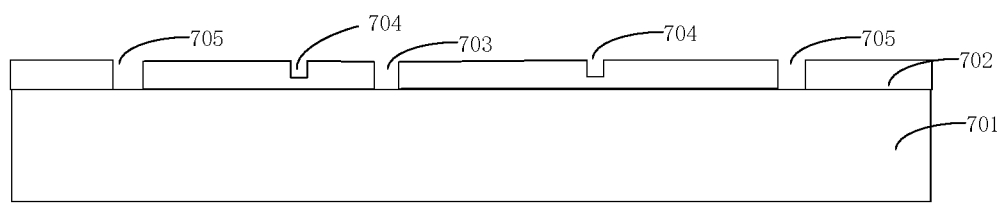
FIG. 18 to FIG. 21 are schematic views of sectional structures of a method for forming an inertial sensor with an anti-stiction structure according to an embodiment of the invention.

Referring to FIG. 18 firstly, a first substrate 701 is provided, and the first substrate 701 includes a first surface and a second surface opposite to the first surface.

The first substrate 701 may be formed of monocrystalline semiconductor material. As an embodiment of the invention, the first substrate 701 is formed of monocrystalline silicon.

A first insulating layer 702 is formed on the first surface of the first substrate 701. The first insulating layer 702 is etched to form a first opening 703, a second opening 704 and a third opening 705 in the first insulating layer 702. It is noted that the second opening is formed only partially into the first insulating layer 702. The first opening 703 is to be filled with conductive material to form a fixed electrode supporting post or other electrical connection or mechanical structure. The second opening 704 is to be filled with conductive material to form an anti-stiction structure subsequently.

The first insulating layer 702 may be formed of dielectric material such as silicon oxide, silicon nitride and silicon oxynitride. As an embodiment, the first insulating layer 702 is formed of silicon oxide.

Figure 19:
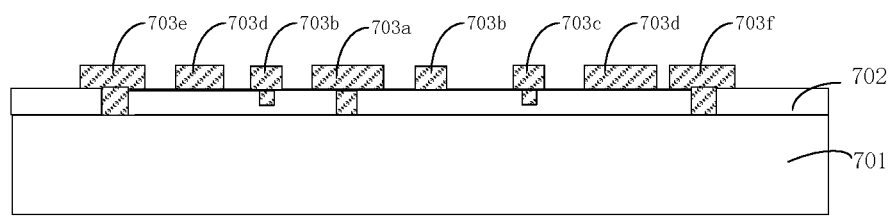

Referring to FIG. 19, a first conductive layer is formed on the first insulating layer 702, the first opening 703, the second opening 704 and the third opening 705 are fully filled with the first conductive layer. The first conductive layer is etched to form a torsion spring interconnecting line 703*a*, a fixed electrode 703*b*, an anti-stiction structure interconnecting line 703*c*, a first interconnecting line 703*d*, a first shielding interconnecting line 703*e* and a second shielding interconnecting line 703*f*.

Figure 20:
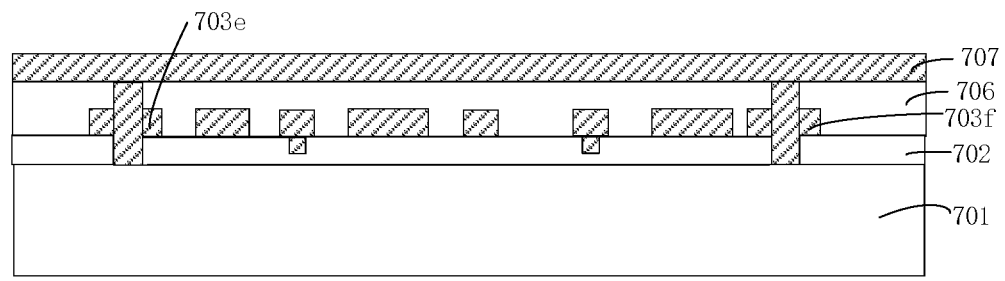

Referring to FIG. 20, a second insulating layer 706 is formed on the first conductive layer, and then openings are formed in the second insulating layer. A second conductive layer 707, as an electrical shielding layer, is formed on the second insulating layer, and the second conductive layer 707 is electrically coupled with the first shielding interconnecting line 703*e* and the second shielding interconnecting line 703*f* correspondingly.

Figure 21:
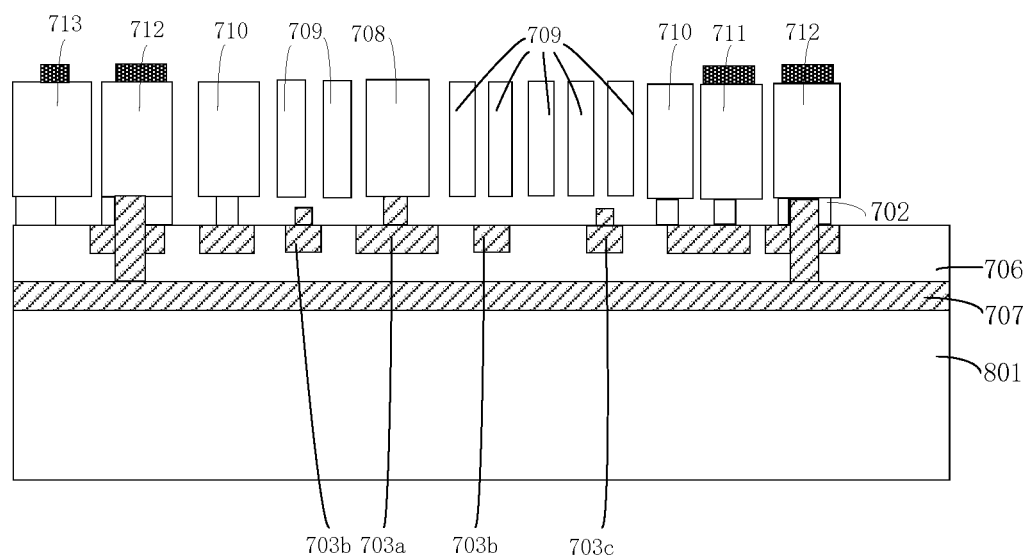

Then referring to the relevant processes shown in FIGS. 9 to 12, after these processes, a movable electrode of the sensor having an anti-stiction structure according to the embodiment of the invention is formed, and the formed structure is shown in FIG. 21, including: a torsion spring 708, a movable electrode 709, a first sensor structure 710, a second sensor structure 711, a sealing structure 712 and a third sensor structure 713. The torsion spring 708 is electrically coupled with the torsion spring interconnecting line 703*a*. The movable electrode 709 is electrically coupled with the movable electrode interconnecting line (not shown). The sealing structure 712 is electrically coupled with the first shielding structure and the second shielding structure. The first sensor structure 710, the second sensor structure 711 and the third sensor structure 713 represent other structures of the formed Z-axis sensor. An anti-stiction structure is formed on the fixed electrode 703*b* under the movable electrode 709 and on the anti-stiction structure interconnecting line 703*c*. The MEMS inertial sensor with an anti-stiction structure according to the embodiment of the invention is formed.

Figure 22:
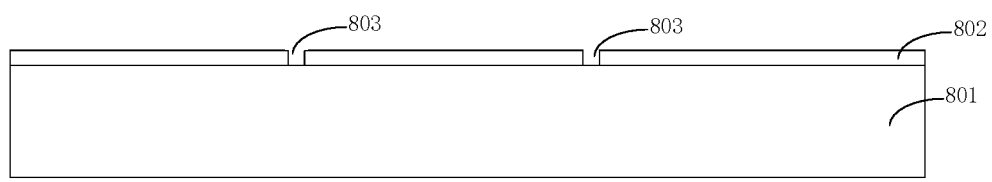
FIG. 22 to FIG. 24 are schematic views of sectional structures of a method for forming an inertial sensor with an anti-stiction structure according to another embodiment of the invention.
Figure 23:
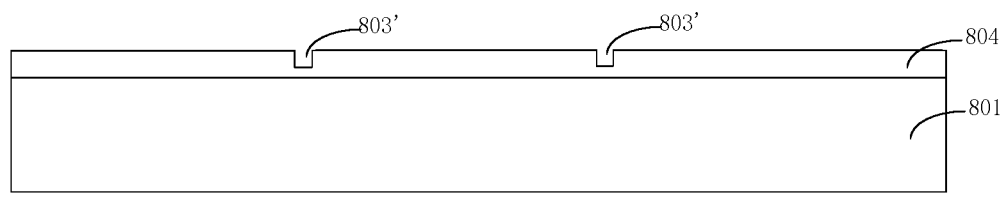
Figure 24:
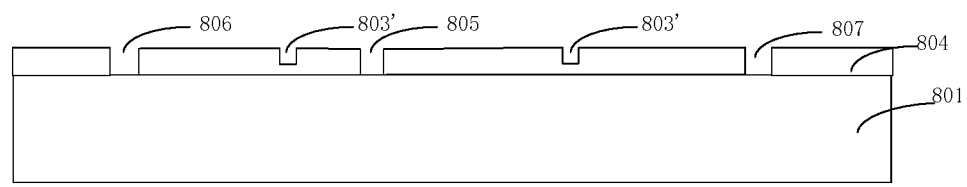

An embodiment of another method for forming a MEMS inertial sensor with an anti-stiction structure is further provided according to the invention, and FIG. 22 to FIG. 24 are referred to.

Referring to FIG. 22, a first substrate 801 is provided, and the first substrate 801 includes a first surface and a second surface opposite to the first surface.

A first sub-insulating layer 802 is formed on the first surface of the first substrate 801. The first sub-insulating layer 802 is etched to form a first opening 803 in the first sub-insulating layer 802, and the first opening 803 is used to form an anti-stiction structure subsequently.

The first sub-insulating layer 802 may be formed in a deposition way. As an embodiment of the invention, the first sub-insulating layer 802 is formed by thermal oxidation. It is noted that the thickness of the first sub-insulating layer 802 does not reach the predetermined thickness of an isolating layer for the interconnecting layer. In the embodiment, the thickness of the first sub-insulating layer 802 is equivalent to the height of the anti-stiction structure. Therefore, the depth of the first opening 803 herein is equivalent to the thickness of the first sub-insulating layer 802, i.e., the first substrate 801 is exposed through the first opening 803.

Referring to FIG. 23, deposition is performed. The thickness of the first sub-insulating layer 802 increases gradually to form a first target insulating layer 804. By controlling the deposition time and conditions, the thickness of the formed first target insulating layer 804 is controlled to be the target thickness.

Because the first opening 803 is initially formed in the first sub-insulating layer, the depth of the first opening is shallower than the thickness of the first target insulating layer 804, and thus a first opening 803' is formed. The first opening 803' is to be filled with the conductive layer to form an anti-stiction structure.

Then referring to FIG. 24, a second opening 805, a third opening 806 and a fourth opening 807 are formed in the first target insulating layer 804. The second opening 805 is to be filled with the conductive material to form a torsion spring interconnecting line or other electrical connection or mechanical structure. The third opening 806 and the fourth opening 807 are to be filled with the conductive material to form shielding interconnecting lines.

Then referring to the aforementioned relevant description of FIGS. 19 to 21, a MEMS inertial sensor with an anti-stiction structure according to the embodiment of the invention may be formed.

In the above-described embodiment, the fixed electrode of the Z-axis sensor is formed by using one or more conductive layers on the first surface of the first substrate. Preferably, the fixed electrode and the anti-stiction structure of the Z-axis sensor are formed by using the conductive layer that is closest to the first substrate.

An embodiment of yet another method for forming a MEMS inertial sensor with an anti-stiction structure is further provided according to the invention, and FIG. 25 to FIG. 28 are referred to.

Figure 25:
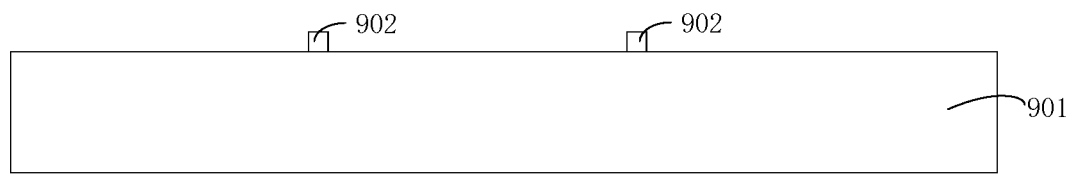
FIG. 25 to FIG. 28 are schematic views of sectional structures of a method for forming an inertial sensor with an anti-stiction structure according to yet another embodiment of the invention.

Referring to FIG. 25, a first substrate 901 is provided. A first mask layer 902 is formed on the first substrate 901, and the position of the first mask layer 902 corresponds to the position for forming the anti-stiction structure subsequently.

Figure 26:
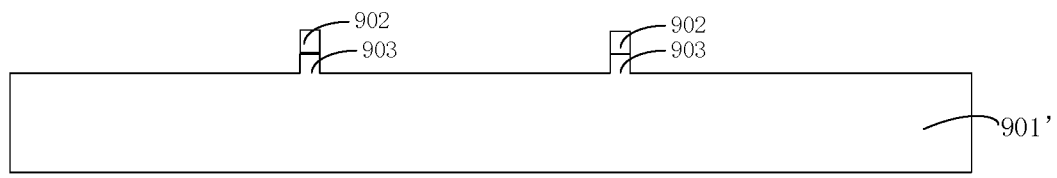

Referring to FIG. 26, the first substrate 901 is etched by using the first mask layer 902, to form a first substrate 901'. Thus an anti-stiction structure 903 is formed at the position covered by the first mask layer 902.

Figure 27:
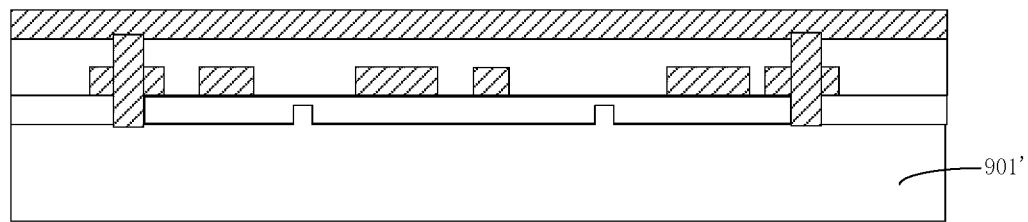
Figure 28:
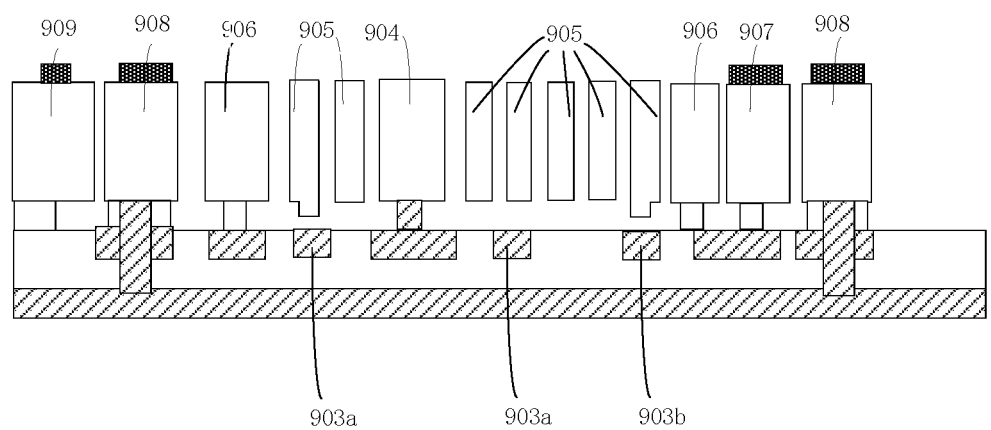

Then referring to FIG. 27, an interconnecting layer and an electrical shielding layer are formed on the first substrate 901', the aforementioned relevant processes of FIG. 19 and FIG. 20 are referred to, which will not be described in detail herein.

Next, the step of forming the movable electrode is performed. The movable electrode having an anti-stiction structure is fabricated by using the first substrate; and a torsion spring 904, a movable electrode 905, a first sensor structure 906, a second sensor structure 907, a sealing structure 908 and a third sensor structure 909 are formed, referring to FIG. 28. The sealing structure 908 is electrically coupled with the first shielding structure and the second shielding structure. The first sensor structure 906, the second sensor structure 907 and the third sensor structure 909 represent other structures of the formed Z-axis sensor. An anti-stiction structure is formed on the movable electrode 905 facing the fixed electrode 903*a* and the anti-stiction structure interconnecting line 903*b*. Thus, a MEMS inertial sensor with an anti-stiction structure on a movable electrode according to yet another embodiment of the invention is formed.

An anti-stiction structure may also be formed on a gyroscopic apparatus. As mentioned above, the gyroscopic apparatus for sensing in each direction (i.e., the X-axis gyroscopic apparatus, the Y-axis gyroscopic apparatus and the Z-axis gyroscopic apparatus) has similar structure elements as those of the acceleration sensor (i.e., the X-axis sensor, the Y-axis sensor and the Z-axis sensor), therefore the method for forming the anti-stiction structure on the gyroscopic apparatus is similar to the method for forming the anti-stiction structure on the acceleration sensor. Thus the method for forming the anti-stiction structure on the gyroscopic apparatus is not described in detail, and those skilled in the art should know how to form the anti-stiction flexibly based on the aforementioned technical solutions.

The invention has been disclosed by the preferred embodiments as above, however these embodiments are not intended to limit the claims. Possible modifications and amendments may be made by those skilled in the art without deviating from the spirit and scope of the invention. Therefore, the scope of protection of the invention should be consistent with the scope defined by the claims of the invention.

The invention claimed is:

1. A method for forming a Micro-Electro-Mechanical-System (MEMS) inertial sensor, comprising:
   providing a first substrate having a first surface and a second surface opposite to the first surface, wherein providing the first substrate comprises providing a first base substrate with the first surface and the second surface being located at two opposite sides of the first base substrate, forming a first conductive layer, an insulating layer and a second conductive layer on one side of the first base substrate closer to the first surface of the first substrate, wherein the first conductive layer is located between the first base substrate and the second conductive layer and the insulating layer is located between the first conductive layer and the second conductive layer, and forming a conductive via between the first conductive layer and the second conductive layer and/or between the second conductive layer and the first base substrate, wherein the first base substrate comprises a monocrystalline material, and wherein forming the first conductive layer and the second conductive layer comprises forming the first conductive layer and the second conductive layer via a deposition process respectively;
   providing a second substrate having a third surface and a fourth surface opposite to the third surface;
   bonding the first surface of the first substrate and the third surface of the second substrate together to form a first substrate bonding interface;
   thinning the first base substrate from a side of the second surface of the first substrate to remove part of the first base substrate; and
   forming a movable element of the MEMS inertial sensor, wherein the movable element comprises all or part of the thinned first base substrate,
   wherein the second conductive layer comprises a shielding layer.

2. The method for forming the MEMS inertial sensor according to claim 1, wherein there is no substrate bonding interface located between the first substrate bonding interface and the first base substrate.

3. The method for forming the MEMS inertial sensor according to claim 1, wherein providing the first substrate further comprises providing a first bonding layer and/or providing the second substrate further comprises providing a second bonding layer, wherein the first surface of the first substrate and the third surface of the second substrate are bonded together by using the first bonding layer and/or the second bonding layer.

4. The method for forming the MEMS inertial sensor according to claim 1, further comprising:
   forming an insulating layer, wherein the insulating layer is located between the first conductive layer and the first substrate bonding interface and wherein the insulating layer comprises a silicon nitride material.

5. The method for forming the MEMS inertial sensor according to claim 1, wherein forming the first conductive layer comprises: forming the first conductive layer by using polycrystalline material and/or amorphous material.

6. The method for forming the MEMS inertial sensor according to claim 1, further comprising: providing a third substrate, wherein the third substrate is located at one side of the first substrate that is opposite to the second substrate, and wherein the third substrate is bonded to the first substrate.

7. A Micro-Electro-Mechanical-System (MEMS) inertial sensor, comprising a first substrate and a second substrate,
   wherein the first substrate has a first surface and a second surface opposite to the first surface;
   wherein the first substrate comprises a first base substrate, the first base substrate comprises a monocrystalline material, and the first surface and the second surface are located at two opposite sides of the first base substrate;
   herein the first substrate further comprises a first conductive layer, an insulating layer, a second conductive layer and a conductive via, wherein the first conductive layer, the insulating layer and the second conductive layer are formed on one side of the first base substrate closer to the first surface of the first substrate, the first conductive layer is located between the first base substrate and the second conductive layer and the insulating layer is located between the first conductive layer and the second conductive layer, and the conductive via is formed between the first conductive layer and the second conductive layer and/or between the second conductive layer and the first base substrate;
   wherein the second substrate has a third surface and a fourth surface opposite to the third surface;
   wherein the first surface of the first substrate and the third surface of the second substrate are bonded together to form a first substrate bonding interface;
   wherein all or part of the first base substrate forms a movable element of the MEMS inertial sensor; and
   wherein the second conductive layer comprises a shielding layer and the shielding layer is located between the first base substrate and the first substrate bonding interface in such a way that there is no substrate bonding interface located between the first substrate bonding interface and the first base substrate.

8. The MEMS inertial sensor according to claim 7, wherein the first substrate further comprises a first bonding layer and/or the second substrate further comprises a second bonding layer, wherein the first surface of the first substrate and the third surface of the second substrate are bonded together by using the first bonding layer and/or the second bonding layer.

9. The MEMS inertial sensor according to claim 7, wherein the first substrate further comprises:
an insulating layer between the first conductive layer and the first substrate bonding interface,
wherein the insulating layer comprises a silicon nitride material.

10. The MEMS inertial sensor according to claim 7, wherein the first conductive layer comprises a polycrystalline material and/or an amorphous material.

11. The MEMS inertial sensor according to claim 7, further comprising: a third substrate located at one side of the first substrate that is opposite to the second substrate, wherein the third substrate is bonded to the first substrate.

12. A method for forming a Micro-Electro-Mechanical-System (MEMS) inertial sensor, comprising:
providing a first substrate having a first surface and a second surface opposite to the first surface, wherein providing the first substrate comprises: providing a first base substrate with the first surface and the second surface being located at two opposite sides of the first base substrate, forming a first conductive layer, an insulating layer and a second conductive layer on one side of the first base substrate closer to the first surface of the first substrate, wherein the first conductive layer is located between the first base substrate and the second conductive layer and the insulating layer is located between the first conductive layer and the second conductive layer, and forming a conductive via between the first conductive layer and the second conductive layer and/or between the second conductive layer and the first base substrate, wherein the first base substrate comprises a monocrystalline material, and wherein forming the first conductive layer and the second conductive layer comprises forming the first conductive layer and the second conductive layer via a deposition process respectively;
providing a second substrate having a third surface and a fourth surface opposite to the third surface;
bonding the first surface of the first substrate and the third surface of the second substrate together to form a first substrate bonding interface;
thinning the first base substrate from a side of the second surface of the first substrate to remove part of the first base substrate; and
forming a movable element of the MEMS inertial sensor, wherein the movable element comprises all or part of the thinned first base substrate.

13. The method for forming the MEMS inertial sensor according to claim 12, wherein forming the second conductive layer comprises forming a shielding layer, wherein the shielding layer is located between the first base substrate and the first substrate bonding interface.

14. The method for forming the MEMS inertial sensor according to claim 12, wherein forming the first conductive layer comprises: forming the first conductive layer by using polycrystalline material and/or amorphous material.

15. A Micro-Electro-Mechanical-System (MEMS) inertial sensor, comprising a first substrate and a second substrate,
wherein the first substrate has a first surface and a second surface opposite to the first surface;
wherein the first substrate comprises a first base substrate, the first base substrate comprises a monocrystalline material, and the first surface and the second surface are located at two opposite sides of the first base substrate;
wherein the first substrate further comprises a first conductive layer, a silicon nitride layer and a second conductive layer that are located on one side of the first base substrate closer to the first surface of the first substrate, and a conductive via, wherein the first conductive layer is located between the first base substrate and the second conductive layer, the silicon nitride layer is located between the first conductive layer and the second conductive layer, and the conductive via is located between the first conductive layer and the second conductive layer and/or between the second conductive layer and the first base substrate;
wherein the second substrate has a third surface and a fourth surface opposite to the third surface;
wherein the first surface of the first substrate and the third surface of the second substrate are bonded together to form a first substrate bonding interface; and
herein all or part of the first base substrate forms a movable element of the MEMS inertial sensor.

16. The MEMS inertial sensor according to claim 15, wherein there is no substrate bonding interface located between the first substrate bonding interface and the first base substrate.

17. The MEMS inertial sensor according to claim 15, wherein the second conductive layer comprises a shielding layer, wherein the shielding layer is located between the first base substrate and the first substrate bonding interface.

18. The MEMS inertial sensor according to claim 15, wherein the first conductive layer comprises a polycrystalline material and/or an amorphous material.

19. The MEMS inertial sensor according to claim 15, further comprising a third substrate, wherein the third substrate is located at one side of the first substrate that is opposite to the second substrate, and wherein the third substrate is bonded to the first substrate.

* * * * *